United States Patent
Lee et al.

(10) Patent No.: US 9,335,631 B2
(45) Date of Patent: May 10, 2016

(54) PHOTOSENSITIVE RESIN COMPOSITION, METHOD FOR MANUFACTURING ORGANIC LAYER USING THE COMPOSITION, AND DISPLAY DEVICE COMPRISING THE ORGANIC LAYER

(71) Applicant: SAMSUNG DISPLAY CO., LTD., Yongin, Gyeonggi-Do (KR)

(72) Inventors: Ki-Beom Lee, Seoul (KR); Sang-Hyun Yun, Suwon-si (KR); Hi-Kuk Lee, Yongin-si (KR); Jae-Hyuk Chang, Seongnam-si (KR); Chang-Hoon Kim, Asan-si (KR); Jung-In Park, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/446,282

(22) Filed: Jul. 29, 2014

(65) Prior Publication Data
US 2015/0168833 A1      Jun. 18, 2015

(30) Foreign Application Priority Data
Dec. 16, 2013 (KR) .......................... 10-2013-0156139

(51) Int. Cl.
  *G03F 7/004*   (2006.01)
  *G03F 7/038*   (2006.01)
  *G03F 7/40*    (2006.01)
  *C08F 220/30*  (2006.01)

(52) U.S. Cl.
  CPC ............ *G03F 7/0388* (2013.01); *C08F 220/30* (2013.01); *G03F 7/40* (2013.01); *C08F 2220/301* (2013.01); *C08F 2220/303* (2013.01)

(58) Field of Classification Search
  CPC ............... C08F 220/30; C08F 220/301; C08F 220/303; C08F 212/08
  USPC .......... 430/285.1, 270.1, 319, 322, 325, 329, 430/330, 331, 913; 526/320, 326
  See application file for complete search history.

(56) References Cited

U.S. PATENT DOCUMENTS

| 6,461,791 B1 | 10/2002 | Hatakeyama et al. |
| 6,537,719 B1 | 3/2003 | Takahashi |
| 6,573,012 B1 | 6/2003 | Lee et al. |
| 6,713,229 B2 | 3/2004 | Choi et al. |
| 6,844,134 B2 * | 1/2005 | Choi ..................... G03F 7/0046 430/270.1 |

(Continued)

FOREIGN PATENT DOCUMENTS

| JP | 2006-243474 A | 9/2006 | |
| JP | 2007-025678 A | * 2/2007 | .............. G03F 7/004 |

(Continued)

OTHER PUBLICATIONS

Machine Translation of JP 2007-025678.*

*Primary Examiner* — Amanda C Walke
(74) *Attorney, Agent, or Firm* — Lewis Roca Rothgerber Christie LLP

(57) ABSTRACT

A photosensitive resin composition includes an acid-labile resin of about 5 wt % to about 25 wt %, a monomer of about 5 wt % to about 10 wt %, a photoacid generator of about 5 wt % to about 10 wt %, a photoreaction accelerator of about 1 wt % to about 5 wt %, and a solvent of about 50 wt % to about 84 wt %, wherein the acid-labile resin comprises a repeating unit containing an acid group, and a protecting group configured to protect the repeating unit.

15 Claims, 6 Drawing Sheets

(56) References Cited

U.S. PATENT DOCUMENTS

| | | | |
|---|---|---|---|
| 7,977,028 B2 | 7/2011 | Yuba et al. | |
| 8,329,380 B2* | 12/2012 | Takita | G03F 7/0045 430/270.1 |
| 8,871,423 B2* | 10/2014 | Yun | G03F 7/004 430/270.1 |
| 2006/0141388 A1* | 6/2006 | Okui | G03F 7/0397 430/270.1 |
| 2009/0186187 A1 | 7/2009 | Lee et al. | |
| 2010/0119973 A1* | 5/2010 | Takita | G03F 7/0045 430/281.1 |
| 2010/0173246 A1* | 7/2010 | Takita | G03F 7/0045 430/280.1 |
| 2011/0151379 A1* | 6/2011 | Choi | G03F 7/0007 430/270.1 |
| 2011/0177302 A1* | 7/2011 | Takita | C08F 20/28 428/195.1 |
| 2013/0003436 A1* | 1/2013 | Kumar | G11C 13/0007 365/100 |
| 2013/0071787 A1* | 3/2013 | Takita | G03F 7/0045 430/280.1 |
| 2013/0075684 A1 | 3/2013 | Kinoshita et al. | |
| 2014/0011136 A1* | 1/2014 | Hatakeyama | G03F 7/004 430/285.1 |
| 2015/0212411 A1* | 7/2015 | Park | G03F 7/038 430/281.1 |

FOREIGN PATENT DOCUMENTS

| | | |
|---|---|---|
| JP | 2011-209679 A | 10/2011 |
| JP | 2013-140336 A | 7/2013 |
| KR | 10-2013-0088776 A | 8/2013 |

\* cited by examiner

PHOTOSENSITIVE RESIN COMPOSITION, METHOD FOR MANUFACTURING ORGANIC LAYER USING THE COMPOSITION, AND DISPLAY DEVICE COMPRISING THE ORGANIC LAYER

CROSS-REFERENCE TO RELATED APPLICATION

This application claims priority to and the benefit of Korean Patent Application No. 10-2013-0156139, filed on Dec. 16, 2013, with the Korean Intellectual Property Office, the content of which is incorporated herein in its entirety by reference.

BACKGROUND

1. Field

Embodiments of the present invention relate to a photosensitive resin composition including a photoacid generator, a method of forming an organic layer using (utilizing) the photosensitive resin composition, and a display device including the organic layer.

2. Description of the Related Art

In a display device employing a thin film transistor (TFT), a protective layer is used (utilized) to protect and insulate the TFT. An inorganic protective layer such as silicon nitride (SiNx) or silicone oxide (SiOx) is mainly used (utilized) as the protective layer. The inorganic protective layer is formed by vacuum deposition, but vacuum deposition is a costly and time-consuming process. Further, the inorganic protective layer has a high dielectric constant, and thus there are limitations to improvement in the aperture ratio of a display device. In order to overcome the limitations, research is being carried out to use (utilize) an organic layer, which has a low permittivity (permeability) and may be formed by a coating method using (utilizing) a liquid composition, as an insulating layer.

In the case where the organic layer is characterized by having photosensitivity in particular, a fine pattern may be formed on the organic layer without an additional process. A photosensitive resin, which participates in a photoreaction to change its solubility in a specific solvent, is used (utilized) to form such an organic layer pattern. A chemically amplified resist may be used (utilized) as the photosensitive resin in which solubility is changed by a photoreaction. The chemically amplified resist contains an acid-labile resin and a photoacid generator, and an acid (H+) is produced from the photoacid generator of a light-exposed area (in an area exposed to light), and the acid amplifies a chemical reaction of the acid-labile resin.

The chemically amplified resist needs activation energy for the chemical reaction of the acid-labile resin, and the activation energy is generally given (provided) by heat. Therefore, a post exposure bake should be further performed to heat the organic layer after exposure (to light) in order to form a pattern using (utilizing) the chemically amplified resist. A separate baking unit is required for the post exposure bake.

Meanwhile, demand for a digital exposure apparatus as an exposure device is increasing. The digital exposure apparatus controls a plurality of spot beams to be on or off to perform selective exposure (of a photosensitive material) to light. In the case of using (utilizing) the spot beams, the selective exposure may be performed without a separate pattern mask. In the case where a pattern is formed on only a particular partial area, such as a contact hole of a display device, the pattern may be simply formed by using (utilizing) a positive photosensitive material and the digital exposure apparatus.

However, in the event that ultraviolet light with a short wavelength, e.g., ultraviolet light with a wavelength of 365 nm, is used (utilized) in the digital exposure apparatus, a metal or mirror part of the digital exposure apparatus may be easily damaged.

SUMMARY

Aspects of embodiments of the present invention are directed toward a photosensitive resin composition capable of forming a pattern even though a post exposure bake (PEB) is not performed.

Further, aspects of embodiments of the present invention are directed toward a photosensitive resin composition capable of forming a pattern by light with relatively long wavelength.

Further, aspects of embodiments of the present invention are directed toward a method of forming an organic layer using (utilizing) the photosensitive resin composition, and to a display device including the organic layer.

According to an embodiment of the present invention, a photosensitive resin composition includes an acid-labile resin of about 5 wt % to about 25 wt %, a monomer of about 5 wt % to about 10 wt %, a photoacid generator of about 5 wt % to about 10 wt %, a photoreaction accelerator of about 1 wt % to about 5 wt %, and a solvent of about 50 wt % to about 84 wt %, wherein the acid-labile resin includes a repeating unit including an acid group, and a protecting group configured to protect the repeating unit.

The protecting group includes at least one selected from 2-tetrahydropyranyl group, vinyl ether group, 2-tetrahydrofuranyl group, 2,3-propylenecarbonate group, methoxy ethoxy ethyl group, and acetoxy ethoxy ethyl group.

The repeating unit may be represented by at least one selected from the following Formulas 1 and 2:

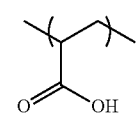

Formula 1

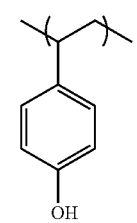

Formula 2

The acid-labile resin includes at least one selected from an acrylic resin and a novolac resin.

The acid-labile resin includes a copolymerized part represented by any one of the following Formulas 6a to 6c:

Formula 6a

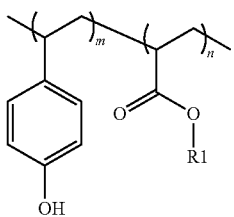

Formula 6b

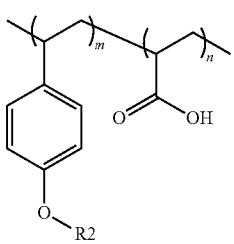

Formula 6c

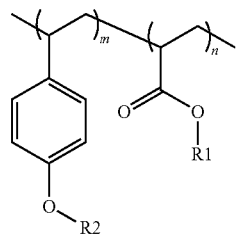

wherein n and m are each independently an integer of 1 to 100, and R1 and R2 are each independently selected from the 2-tetrahydropyranyl group, vinyl ether group, 2-tetrahydrofuranyl group, 2,3-propylenecarbonate group, methoxy ethoxy ethyl group, and acetoxy ethoxy ethyl group.

The monomer includes at least one selected from vinyl-based monomer, acrylic-based monomer, styrene-based monomer, and phenol-based monomer.

The photoacid generator is activated by h-line.

The photoacid generator includes at least one selected from compounds represented by the following Formulas 7a to 7c and 8a to 8c:

Formula 7a

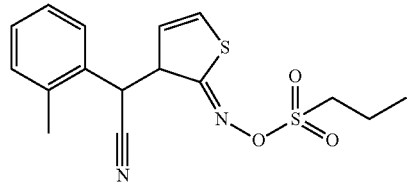

Formula 7b

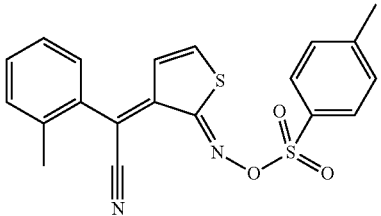

Formula 7c

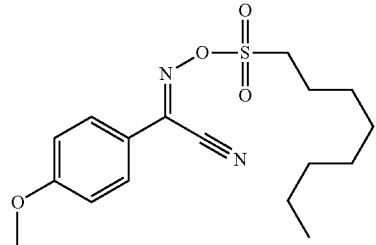

Formula 8a

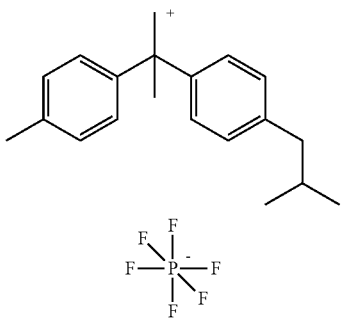

Formula 8b

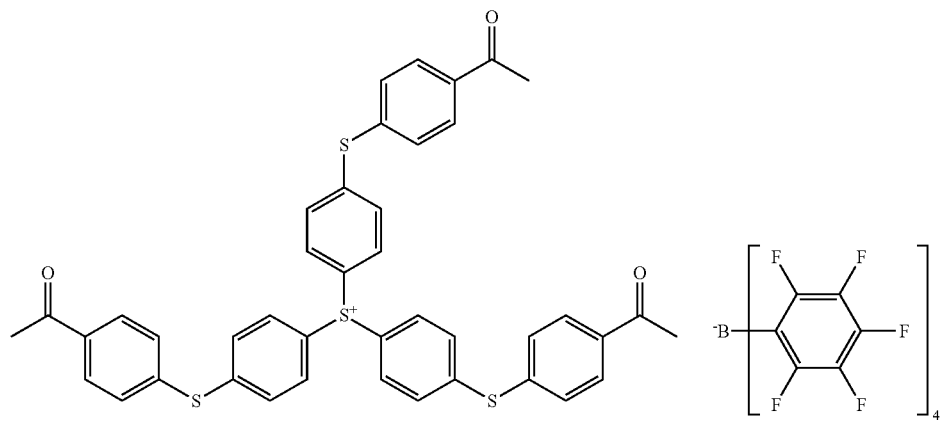

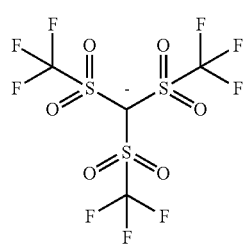

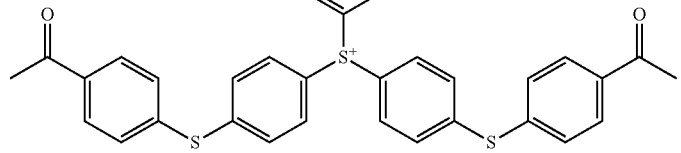

Formula 8c

The photoreaction accelerator includes at least one selected from a sensitizer and a wavelength shifter.

The sensitizer includes at least one selected from diethylenethioxanthone (DETX), violanthrone, iso-violanthrone, fluoresceine, rubrene, 9,10-Diphenylanthracene, tetracene, 13,13'-Dibenzantronile, and levulinic acid.

The wavelength shifter includes at least one selected from n-(2-phenyl-1,3-benzoxazol-5-yl)naphthalene-1-1-carboxamide, 7-(diethylamino)-4-(trifluoromethyl)-2H-chromen-2-one, p-Terphenyl (PTP), diphenyloxazole-benzene (POPOP), diphenyloxazole (PPO), and tetraphenyl-butadiene (TPB).

According to another embodiment of the present invention, a method of forming an organic layer includes forming a photosensitive resin layer by coating the photosensitive resin composition on a substrate, selectively exposing the photosensitive resin layer to light, developing the selectively exposed photosensitive resin layer, and curing the photosensitive resin layer.

The method further includes removing a solvent after the forming of the photosensitive resin layer and before the exposing selectively.

The substrate is for the use of a display device.

According to yet another embodiment of the present invention, a display substrate includes a substrate and an organic layer on the substrate, wherein the organic layer includes an acid-labile resin having a polymerization unit represented by any one selected from the following Formulas 6a to 6c, and a photoacid generator:

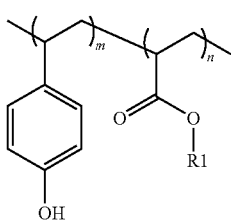

Formula 6a

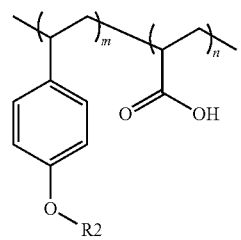

Formula 6b

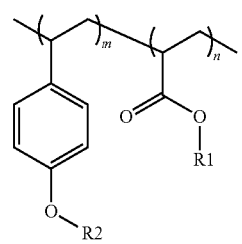

Formula 6c wherein n and m are each an integer of 1 to 100, and R1 and R2 are each independently selected from 2-tetrahydropyranyl group, vinyl ether group, 2-tetrahydrofuranyl group, 2,3-propylenecarbonate group, methoxy ethoxy ethyl group, and acetoxy ethoxy ethyl group.

According to embodiments of the present invention, the photosensitive resin composition may be activated by light within a region of far ultraviolet light with a wavelength of 400 nm or more, and may be polymerized and cross-linked to be easily formed as an organic layer having a pattern.

Further, according to embodiments of the present invention, in the case of using (utilizing) the photosensitive resin composition, a pattern may be formed even though the post exposure bake is not performed. Therefore, lithography using (utilizing) a photoresist is not required for forming the pattern.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Figure 1:
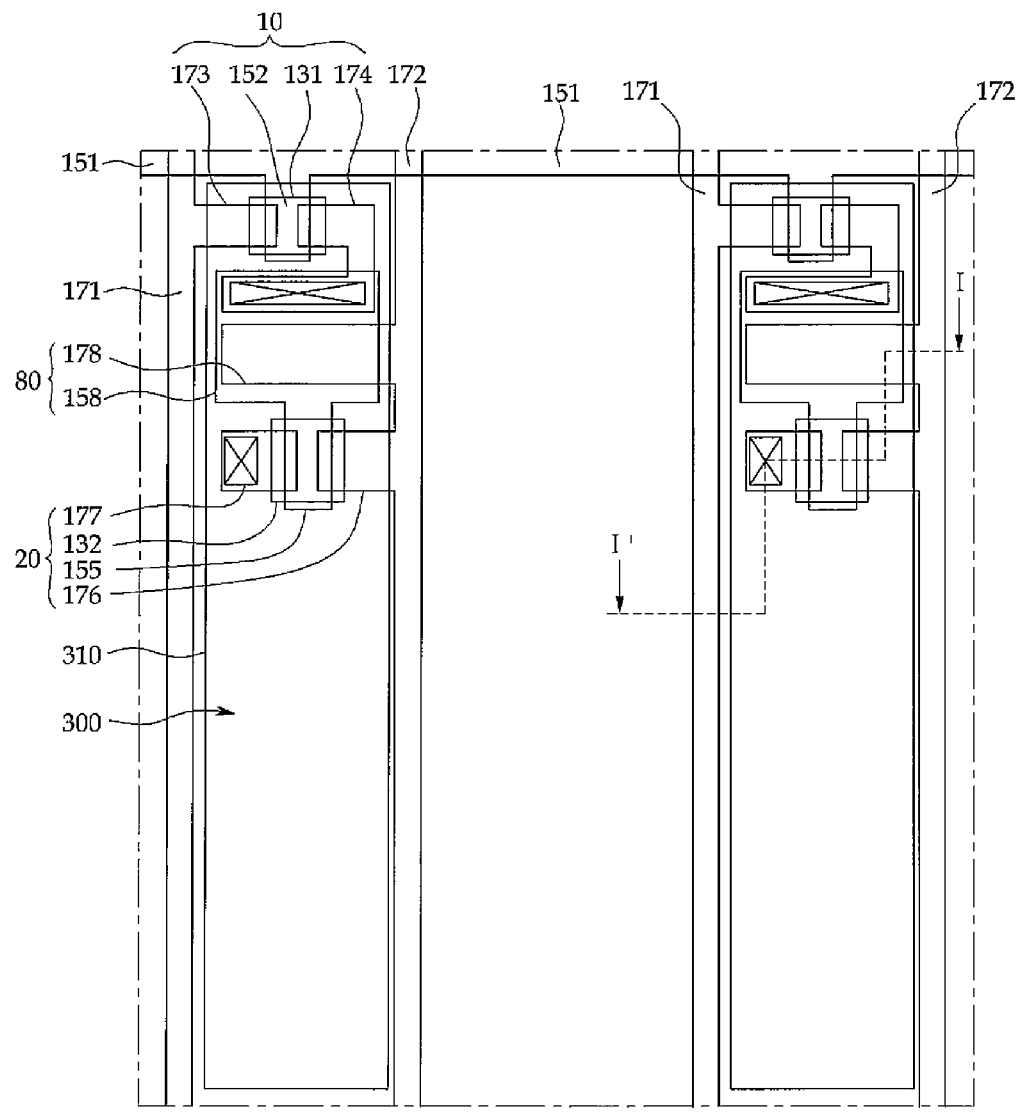
FIG. 1 is a plan view illustrating an organic light emitting diode (OLED) display according to an embodiment of the present invention.

Hereinafter, embodiments of the present invention will now be described in more detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, certain elements or shapes may be simplified or exaggerated to better illustrate the present invention, and other elements present in an actual product may also be omitted. Thus, the drawings are intended to facilitate the understanding of the present invention. Like reference numerals refer to like elements throughout the specification. Further, the use of "may" when describing embodiments of the present invention refers to "one or more embodiments of the present invention."

In addition, when a layer or element is referred to as being "on" another layer or element, the layer or element may be directly on the other layer or element, or one or more intervening layers or elements may be interposed therebetween.

R, R1, R2, and the like, which are substituents represented by formulas, may be identical to or different from each other in the respective formulas. Further, although the substituents are written in the same way by using (utilizing) R1 or R2 in the different formulas, they may differ from each other between the formulas.

According to an embodiment of the present invention, a photosensitive resin composition includes an acid-labile resin, a monomer, a photoacid generator, a photoreaction accelerator, and a solvent. The photosensitive resin composition may further include an appropriate additive as necessary.

In more detail, the photosensitive resin composition includes an acid-labile resin of about 5 wt % to about 25 wt %, a monomer of about 5 wt % to about 10 wt %, a photoacid generator of about 5 wt % to about 10 wt %, a photoreaction accelerator of about 1 wt % to about 5 wt %, and a solvent of about 50 wt % to about 84 wt %, based on the total weight of the composition, wherein the acid-labile resin includes a repeating unit containing an acid group, and a protecting group configured to protect the repeating unit.

The acid-labile resin includes a repeating unit containing an acid group, and at least a part of the acid group of the repeating unit is protected by the protecting group. The acid-labile resin protected by the protecting group is deprotected by acid to be soluble in an alkaline solution.

The repeating unit included in the acid-labile resin and containing the acid group may be represented by the following Formula 1 or 2:

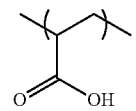

Formula 1

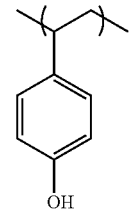

Formula 2

The acid-labile resin may include any one of the repeating units represented by Formulas 1 and 2, or may include all of the repeating units. The acid-labile resin may also include other, repeating units as well as the repeating units represented by Formulas 1 and 2.

Formula 1 is a basic unit of an acrylic resin, and Formula 2 is a basic unit of a novolac resin. Therefore, the acid-labile resin may include an acrylic-based resin or a novolac-based resin. Further, the acid-labile resin may include both of the acrylic-based resin and the novolac-based resin, or may include a copolymer of the acrylic-based resin and the novolac-based resin. For example, the acid-labile resin may include a block copolymerized part (segment) including the acrylic resin region and the novolac resin region as represented by the following Formula 3:

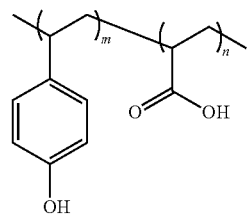

Formula 3

The repeating unit represented by Formulas 1 and 2 may be protected by the protecting group. In other words, the repeating unit having the acid group in the acid-labile resin may be represented by the following Formulas 4 and 5 by being protected by R1 and R2:

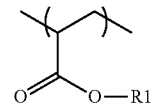

Formula 4

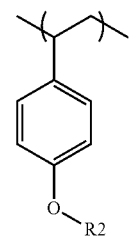

Formula 5

The block copolymerized part represented by Formula 3 may also be represented by at least one of the following Formulas 6a to 6c by being protected by R1 and/or R2:

Formula 6a

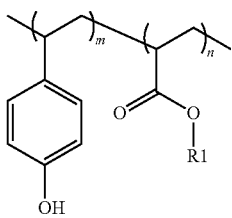

Formula 6b

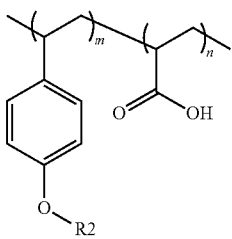

Formula 6c

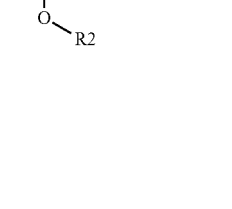

wherein R1 and R2 may be identical to or different from each other as a protecting group, and n and m are each an integer of 1 to 100.

The acid-labile resin of which the acid group is protected by the protecting group is decomposed by an acid (H$^+$) produced by the photoacid generator (PAG) so as to be deprotected. A reaction mechanism, in which the acid-labile resin is deprotected by the acid (H$^+$) produced by the photoacid generator, may be briefly represented by the following Equation 1:

Equation 1

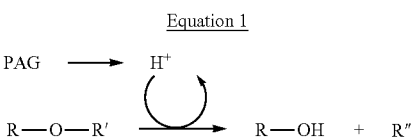

For instance, in the case where the acid-labile resin includes a polymerized part represented by Formula 6a, the reaction mechanism of deprotection of the acid-labile resin may be represented by the following Equation 2:

Equation 2

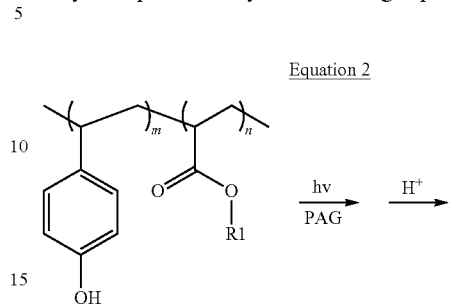

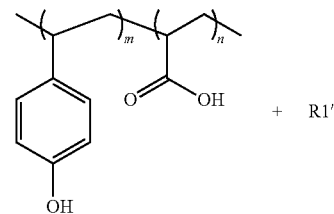

In Equations 1 and 2, the photoacid generator reacts with photon energy (hv) to produce an acid (H$^+$), the acid (H$^+$) reacts with the acid-labile resin so that the acid-labile resin is deprotected. The resin (R—OH) deprotected by the acid (H$^+$) produced by the photoacid generator is in a state of being soluble in an alkaline solution, and thus has development properties to the alkaline solution (may be removed by an alkaline solution). The photosensitive resin that may cause the reaction is called a chemically amplified photosensitive resin.

As described above, the photosensitive resin in which a light-irradiated part has development properties is a positive photosensitive resin, and a composition to form the photosensitive resin is a positive photosensitive resin composition.

The deprotection reaction of the acid-labile resin is generally an exothermic reaction. Further, activation energy is necessary to initiate the deprotection reaction of the acid-labile resin. A post exposure bake is conventionally performed to supply the activation energy to the acid-labile resin. However, a separate baking unit is required for the post exposure bake, and undesired polymerization occurs due to the post exposure bake, thereby lowering the development properties of the light-exposed part.

According to an embodiment of the present invention, the deprotection reaction of the acid-labile resin may smoothly occur without the post exposure bake by using (utilizing) a protecting group that may reduce the activation energy for the deprotection reaction. Therefore, although the post exposure bake is not performed, a pattern may be formed by using (utilizing) the photosensitive resin composition.

The protecting group may include at least one selected from 2-tetrahydropyranyl group, vinyl ether group, 2-tetrahydrofuranyl group, 2,3-propylenecarbonate group, methoxy ethoxy ethyl group, and acetoxy ethoxy ethyl group, for example. Herein, the vinyl ether group may include vinyl ethers (e.g., methyl vinyl ether, ethyl vinyl ether, n-butyl vinyl ether, t-butyl vinyl ether, 2-chloroethyl vinyl ether, 1-methoxyethyl vinyl ether, 1-benzyloxyethyl vinyl ether, and/or the like), isopropenyl ethers (e.g., isopropenyl methyl ether, isopropenyl ethyl ether, and/or the like), cyclic vinyl ethers (e.g., 3,4-dihydro-2H-pyran, and/or the like), and/or divinyl ethers (e.g., butanediol-1,4-divinyl ether, ethylene glycol divinyl ether, triethylene glycol divinyl ether, and/or the like). The vinyl ether group may be used (utilized) alone or in combination of two or more kinds thereof.

Light sources for exposure may include, for example, ArF excimer laser (193 nm), F2 excimer laser (157 nm), extreme ultraviolet (EUV) laser (13.5 nm), and i-line (365 nm). Light with short wavelengths generated by the light sources may damage metal equipment, e.g., a hinge portion of an exposure device or an aluminum layer of a mirror.

According to an embodiment of the present invention, the photosensitive resin composition is exposed to light with relatively long wavelengths such as h-line (405 nm) so as to form a pattern. In the case where the h-line is used (utilized) for the exposure, the damage to the exposure device, which is caused by the light sources, may be reduced or suppressed. The photosensitive resin composition includes the photoacid generator that is activated by the h-line.

The photoacid generator, which produces an acid when exposed to the h-line, may be prepared by those skilled in the art where necessary, or commercially available products may be used (utilized) for the photoacid generator.

The photoacid generator may include, for example, aryl sulfonium salt-based compound, aryliodonium salt-based compound, and/or sulfonate-based compound.

According to an embodiment of the present invention, one or more compounds represented by the following Formulas 7a to 7c may be used (utilized) as the photoacid generator:

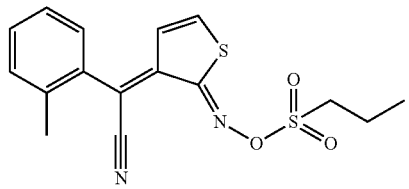

Formula 7a

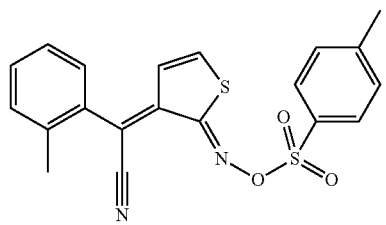

Formula 7b

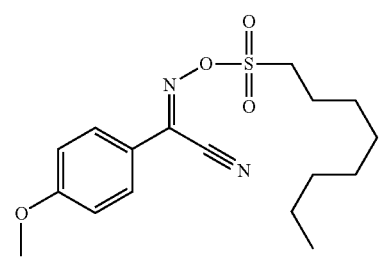

Formula 7c

The photoacid generator represented by Formulas 7a to 7c may be exposed to the h-line so as to be activated.

In addition, the photoacid generator may include at least one selected from triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, and norbornene-dicarboximide PFOS.

One or more ionic photoacid generators represented by the following Formulas 8a to 8c may also be used (utilized):

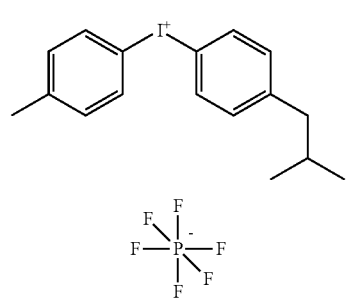

Formula 8a

-continued

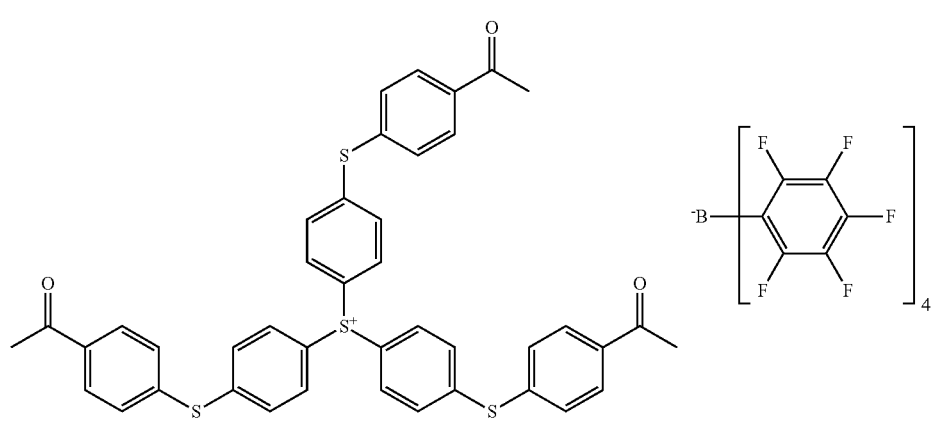

Formula 8b

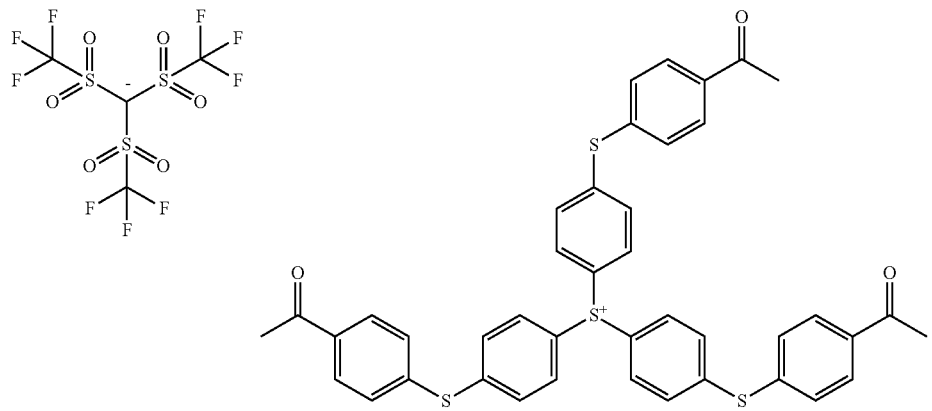

Formula 8c

The photoacid generator represented by Formula 8a is activated by an e-beam, and the photoacid generators represented by Formulas 8b and 8c are activated by the i-line (365 nm). In the case where a sensitizer is used (utilized), the photoacid generators represented by Formulas 8a to 8c may be activated by the h-line.

The sensitizer increases efficiency in light absorption of a photosensitive material. In the case where the sensitizer is used (utilized), light efficiency may be improved and activation energy for deprotection reaction may be reduced, and thus the deprotection reaction may smoothly occur with a small amount of the photoacid generator. Further, the sensitizer enables the photoacid generator to be activated by different wavelengths in addition to the typical wavelengths utilized for activating the photoacid generator so that the choice of suitable photoacid generators may broaden for the light sources.

The sensitizer may include at least one selected from diethylenethioxanthone (DETX), violanthrone, iso-violanthrone, fluoresceine, rubrene, 9,10-diphenylanthracene, tetracene, 13 13'-dibenzantronile, and levulinic acid.

A material used (utilized) for photoreaction like the sensitizer is called a photoreaction accelerator. The photoreaction accelerator includes a wavelength shifter besides the sensitizer.

The wavelength shifter absorbs light and emits light with wavelengths that are different from those of the absorbed light. The wavelength shifter may include a phosphor. The photosensitive resin composition including a set or predetermined wavelength shifter may have the same effect as the photosensitive resin composition to which light with wavelengths other than the wavelengths emitted by the light sources is irradiated. Therefore, in the case of using (utilizing) the wavelength shifter having appropriately absorbed and re-emitted wavelengths, the range of choice of the light sources widens, and thus the range of choice of the photoacid generator also widens. Further, the solvent, acid-labile resin, and monomer, which are contained in the photosensitive resin composition, may also have wavelength selectivity, and in the case of using (utilizing) the wavelength shifter, the solvent, acid-labile resin, and monomer may be selected in various ways with respect to a specific light source.

The wavelength shifter may include at least one selected from N-(2-Phenyl-1,3-benzoxazol-5-yl)naphthalene-1-1-carboxamide, 7-(diethylamino)-4-(trifluoromethyl)-2H-Chromen-2-one, p-Terphenyl (PTP), diphenyloxazole-benzene (POPOP), diphenyloxazole (PPO), and tetraphenylbutadiene (TPB).

The photosensitive resin composition may include a monomer in order to form a stable organic layer. In more detail, a photosensitive resin pattern is formed, and thereafter the photosensitive resin composition may be stably converted into the organic layer by a polymerization or cross-linking reaction of the monomer in a process of curing the photosensitive resin pattern. For the cross-linking reaction, the monomer may have a reactive group such as epoxy group or unsaturated hydrocarbon group. The acid-labile resin may also be polymerized and cross-linked by a suitable polymerization and cross-linking process so as to be stable in the organic layer. The photoacid generator is trapped in a cross-linked polymer structure that is formed by the monomer. As a result, the organic layer becomes stable.

An example of the monomer may include a vinyl-based monomer, acrylic-based monomer, styrene-based monomer, and/or phenol-based monomer. In more detail, the monomer may include 4-acetoxystyrene, 3-acetoxystyrene, or 2-acetoxystyrene; 4-alkoxystyrene, 3-alkoxystyrene, or 2-alkoxystyrene; α-methylstyrene; 4-alkylstyrene, 3-alkylstyrene, or 2-alkylstyrene; 3-alkyl-4-hydroxystyrene; 3,5-dialkyl-4-hydroxystyrene; 4-chlorostyrene, 3-chlorostyrene, or 2-chlorostyrene; 3-chloro-4-hydroxystyrene; 3,5-dichloro-4-hydroxystyrene; 3-bromo-4-hydroxystyrene; 3,5-dibromo-4-hydroxystyrene; vinylbenzyl chloride; 2-vinylnaphthalene; vinylanthracene; vinylaniline; vinylbenzoic acid; vinylbenzoic acid esters; n-vinylpyrrolidone; 1-vinylimidazole; 4-vinylpyridine or 2-vinylpyridine; 1-vinyl-2-pyrrolidone; N-vinyl lactam; 9-vinylcarbazole; vinyl benzoate; acrylic acid and its derivatives; methacrylic acid and its derivatives (e.g., methyl methacrylate and its derivatives); methacrylamide and its derivatives; acrylonitrile; methacrylonitrile; 4-vinylbenzoic acid esters; 4-vinylphenoxyacetic acid and its derivatives (e.g., 4-vinylphenoxyacetic acid esters); maleimide and its derivatives; N-hydroxymaleimide and its derivatives; anhydrous maleic acid; maleic acid or fumaric acid and their derivatives (e.g., maleic acid or fumaric acid ester); vinyltrimethylsilane; vinyltrimethoxysilane or vinylnorbornene and their derivatives; and/or the like.

Another example of the monomer may include isoprope-nylphenol, propenylphenol, (4-hydroxyphenyl)acrylate or methacrylate, (3-hydroxyphenyl)acrylate or methacrylate, (2-hydroxyphenyl)acrylate or methacrylate, N-(4-hydroxyphenyl)acrylamide or methacrylamide, N-(3-hydroxyphenyl)acrylamide or methacrylamide, N-(2-hydroxyphenyl) acrylamide or methacrylamide, N-(4-hydroxybenzyl) acrylamide or methacrylamide, N-(3-hydroxybenzyl) acrylamide or methacrylamide, N-(2-hydroxybenzyl) acrylamide or methacrylamide, 3-(2-hydroxy-hexafluoropropyl-2)-styrene, 4-(2-hydroxy-hexafluoropropyl-2)-styrene, and/or the like.

Each element of the photosensitive resin composition are mixed to form a composition by using (utilizing) a solvent. The solvent may include at least one selected from propylene glycol monomethyl ether acetate, ethyl ethoxy propionate, cyclohexanone, dipropylene glycol monomethyl ether acetate, n-butyl acetate, isobutyl acetate, ethylene glycol monomethyl acetate, ethylene glycol n-butyl acetate, diethylene glycol dimethyl ether, dipropylene glycol monomethyl acetate, diethylene glycol methyl ether, dipropylene glycol n-butyl ether, tripropylene glycol n-butyl ether, tripropylene glycol methyl ether, propylene glycol methyl ether acetate, propylene glycol diacetate, 3-ethoxy propionic acid methyl, methanol, ethanol, methyl cellosolve monomethyl ether, ethyl cellosolve acetate, diethylene glycol monomethyl ether, methyl ethyl ketone, 4-Hydroxy-4-methyl-2-pentanone, 2-hydroxy 2-methylpropionic acid ethyl, and butyl cellosolve acetate.

The photosensitive resin composition may include an acid-labile resin of about 5 wt % to about 25 wt %, a monomer of about 5 wt % to about 10 wt %, a photoacid generator of about 5 wt % to about 10 wt %, and/or a photoreaction accelerator of about 1 wt % to about 5 wt %, with respect to the total weight of the composition, and a residual solvent.

In more detail, in the case where an acid-labile resin content is too low, developing may not be properly performed, and in the case where the acid-labile resin content is too high, it may be difficult to form the organic layer. Therefore, the acid-labile resin may be about 5 wt % to about 25 wt % of the total weight of the photosensitive resin composition.

In the case where a monomer content is too low, it may be difficult to form the organic layer, and in the case where the monomer content is too high, undesired polymerization or cross-linking occurs, thereby lowering the development properties. Therefore, the monomer may be about 5 wt % to about 10 wt % of the total weight of the photosensitive resin composition.

In the case where a photoacid generator content is too low, the acid-labile resin may not be smoothly deprotected, thereby lowering the development properties, and in the case where the photoacid generator content is too high, it may be difficult to form the organic layer and light transmission may be low. Therefore, the photoacid generator may be about 5 wt % to about 10 wt % of the total weight of the photosensitive resin composition.

The sensitizer and wavelength shifter, which act as a photoreaction accelerator, may be used (utilized) together, or any one of these may be used (utilized) alone. In the case where a photoreaction accelerator content is too low, it may not have much catalyst effect, and in the case where the photoreaction accelerator content is too high, it may have too much (high) catalyst effect, but the catalyst effect may remain the same beyond a set or predetermined photoreaction accelerator content. Therefore, in one embodiment, the photoreaction accelerator is about 1 wt % to about 5 wt % of the total weight of the photosensitive resin composition.

Further, the photosensitive resin composition may further include surfactants whose concentration ranges from about 30 ppm to about 200 ppm.

Hereinafter, a display device according to an embodiment of the present invention will be described with reference to FIGS. 1 and 2.

FIG. 1 is a plan view illustrating an organic light emitting diode (OLED) display as an example of a display device. According to an embodiment of the present invention, the OLED display includes a first substrate 100, a wiring part 200, a pixel defining layer 190, and an organic light emitting diode 300 (see FIG. 2).

The first substrate 100 may include an insulating substrate selected from glass, quartz, ceramic, and plastic.

A buffer layer 120 may be disposed on the first substrate 100. The buffer layer 120 may serve to planarize a surface while reducing or preventing undesirable elements, e.g., impurities or moisture, from penetrating into the wiring part 200 or the organic light emitting diode 300. However, the buffer layer 120 is not always necessary and may not be provided according to kinds of the first substrate 100 and process conditions thereof.

The OLED display illustrated in FIG. 1 has a 2Tr-1 Cap structure in which two thin film transistors (TFTs) 10 and 20 and one capacitor 80 are provided for each pixel. However, the structure of the OLED display is not limited thereto. Herein, the pixel is the smallest unit that displays an image, and the OLED display displays an image through a plurality of pixels.

Each pixel includes a switching thin film transistor 10, a driving thin film transistor 20, a capacitor 80, and an organic light emitting diode (OLED) 300. Herein, a configuration including the switching TFT 10, the driving TFT 20, and the capacitor 80 is referred to as a wiring part 200. Further, a gate line 151 extending in one direction, and a data line 171 and a common power source line 172 that are insulated from and intersect (cross) the gate line 151 are disposed on the wiring part 200. A pixel may be defined by the gate line 151, the data line 171, and the common power source line 172 as a boundary, but it is not limited thereto. The pixel may also be defined by the pixel defining layer 190.

The capacitor 80 includes a pair of capacitor plates 158 and 178 with an interlayer insulating layer 160 interposed therebetween. Herein, the interlayer insulating layer 160 may include a dielectric material. Capacitance of the capacitor 80 is determined by a charge charged in the capacitor 80 and a voltage between both capacitor plates 158 and 178.

The switching TFT 10 includes a semiconductor layer 131, a gate electrode 152, a source electrode 173, and a drain electrode 174. The driving TFT 20 also includes a semiconductor layer 132, a gate electrode 155, a source electrode 176, and a drain electrode 177. The semiconductor layers 131 and 132 are insulated from the gate electrodes 152 and 155 by a gate insulating layer 130.

The switching TFT 10 is used (utilized) as a switching element configured to select a pixel that emits light. The gate electrode 152 is connected to the gate line 151, the source electrode 173 is connected to the data line 171, and the drain electrode 174 is spaced apart from the source electrode 173 and is connected to the capacitor plate 158.

The driving TFT 20 applies driving power to a first electrode 310, which is a pixel electrode, for light emission of an organic light emitting layer 320 of the OLED 300 in a selected pixel. The gate electrode 155 of the driving TFT 20 is connected to the capacitor plate 158 that is connected to the drain electrode 174 of the switching TFT 10. The source electrode 176 of the driving TFT 20 and the other capacitor plate 178 are connected to the common power source line 172.

A planarization layer 165 is disposed on the interlayer insulating layer 160, and the drain electrode 177 of the driving TFT 20 is connected to the first electrode 310 of the OLED 300 through a contact hole of the planarization layer 165.

With the above-described structure, the switching TFT 10 is driven by a gate voltage applied to the gate line 151 so as to transmit a data voltage applied to the data line 171 to the driving TFT 20. A voltage, equivalent to a difference between a common voltage applied from the common power source line 172 to the driving TFT 20 and the data voltage transmitted by the switching TFT 10, is stored in the capacitor 80, and a current corresponding to the voltage stored in the capacitor 80 flows to the OLED 300 through the driving TFT 20, so that the OLED 300 emits light.

The OLED 300 includes the first electrode 310 acting as an anode, a second electrode 330 acting as a cathode, and the organic light emitting layer 320 between the first electrode 310 and the second electrode 330.

Figure 2:
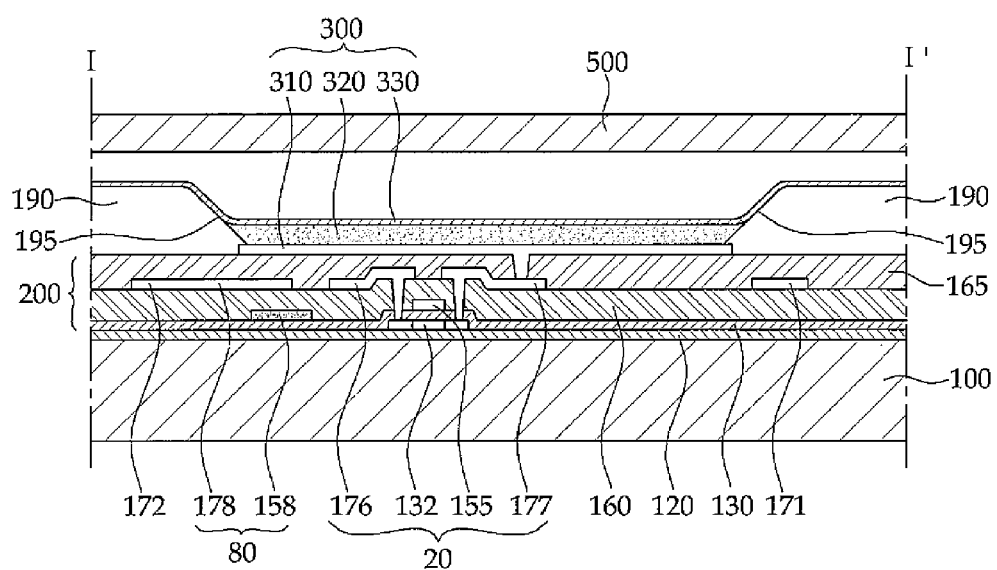
FIG. 2 is a cross-sectional view taken along the line I-I' of FIG. 1.

The OLED display illustrated in FIGS. 1 and 2 has a top emission structure. In other words, light generated from the organic light emitting layer 320 is emitted by passing through the second electrode 330. Therefore, the first electrode 310 is configured to be a reflective layer, and the second electrode 330 is configured to be a transflective layer having (providing) light transmission.

The pixel defining layer 190 is disposed on the first substrate 100 in order to insulate a plurality of the first electrodes 310 from each other and define an emission area.

Although not illustrated, at least one selected from a hole injection layer (HIL) and a hole transporting layer (HTL) may be disposed between the first electrode 310 and the organic light emitting layer 320, and at least one selected from an electron transporting layer (ETL) and an electron injection layer (EIL) may be disposed between the second electrode 330 and the organic light emitting layer 320.

A second substrate 500 may be disposed on the OLED 300. The second substrate 500 may be a transparent insulating substrate including glass, quartz, ceramic, and/or plastic. In this case, the second substrate 500 may be spaced apart from the OLED 300.

Hereinafter, according to an embodiment of the present invention, a method of forming an organic layer using (utilizing) a photosensitive resin composition and a method of manufacturing a display device including the organic layer will be described with reference to FIGS. 3A to 3I. The repeated description of the methods will be omitted.

Figure 3A:
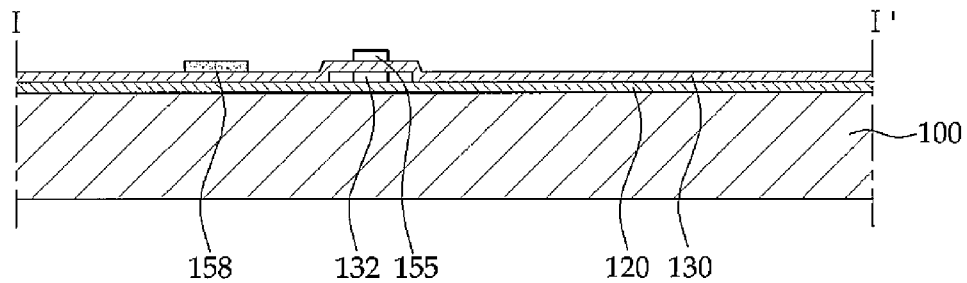
FIGS. 3A to 3I are schematic diagrams illustrating a method of manufacturing an OLED display applied with an organic layer according to an embodiment of the present invention.

The buffer layer 120 is disposed on the first substrate 100, the semiconductor layer 132 is disposed on the buffer layer 120, the gate insulating layer 130 is disposed on the semiconductor layer 132, the gate electrode 155 is disposed on the gate insulating layer 130 to overlap the semiconductor layer 132, and the first capacitor plate 158 is disposed on the gate insulating layer 130 to be spaced apart from the gate electrode 155 (see FIG. 3A).

Figure 3B:
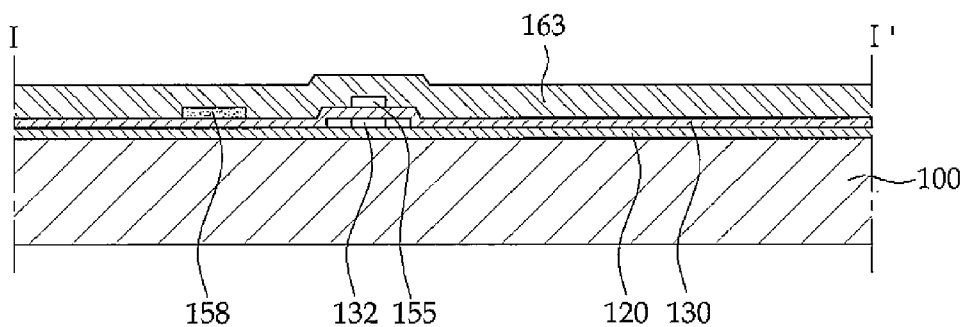
Figure 3C:
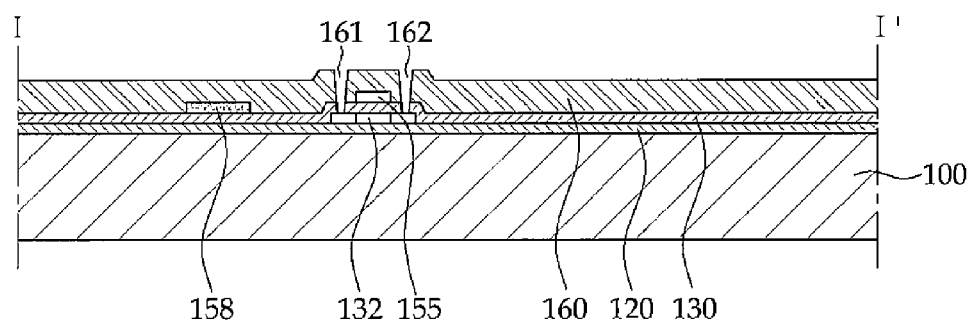
Figure 3D:
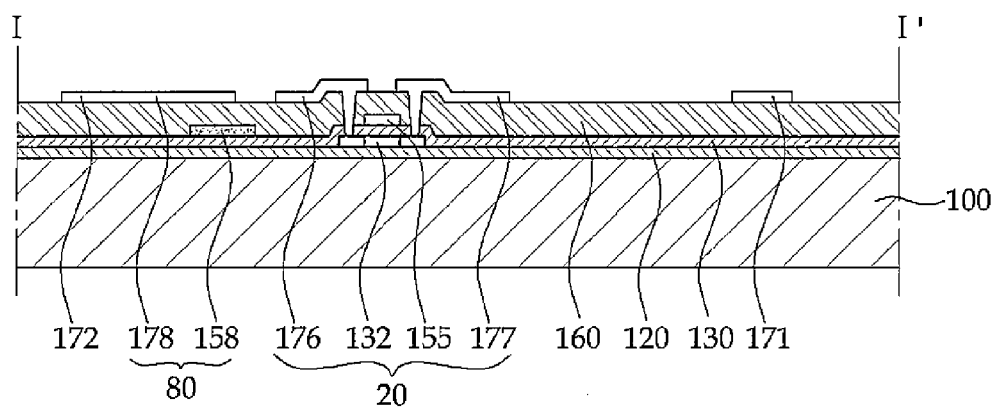

In order to form the interlayer insulating layer 160, the photosensitive resin composition is coated on the entire surface of the gate insulating layer 130 including the gate electrode 155 and the first capacitor plate 158, and a solvent is removed by pre-bake, so that a photosensitive resin layer 163 is formed (see FIG. 3B).

Any suitable method, e.g., spray coating, roll coating, gravure coating, or printing, may be used (utilized) to coat the photosensitive resin composition. The pre-bake may be performed at a temperature of about 60° C. to about 130° C.

A contact hole-forming region for the source electrode and a contact hole-forming region for the drain electrode are selectively exposed to light by an exposure apparatus. In the case where a digital exposure apparatus is used (utilized), the exposure may be performed without a separate pattern mask. The photosensitive resin layer 163 formed by the photosensitive resin composition contains a photoacid generator that is activated by h-line, and thus the h-line may be used (utilized) as a light source. When the acid-labile resin is included in the photosensitive resin composition, the activation energy required for deprotection reaction is low, and thus the deprotection reaction may occur in an exposed area although the post exposure bake is not performed. After the exposure, the photosensitive resin layer 163 is developed by using (utilizing) an alkaline solution so that a contact hole 161 for the source electrode and a contact hole 162 for the drain electrode are formed. Next, a heat treatment is performed to cure the residual photosensitive resin layer 163 so that the photosensitive resin layer 163 is heat-cured, thereby forming the interlayer insulating layer 160 including the organic layer (see FIG. 3C). In this case, the heat treatment may be performed at a temperature of about 150° C. to about 350° C.

The interlayer insulating layer 160 formed by the heat treatment may include the organic layer having the contact hole 161 for the source electrode and the contact hole 162 for the drain electrode as a pattern.

The source electrode 176 and the drain electrode 177 are formed on the interlayer insulating layer 160. The source electrode 176 and the drain electrode 177 are connected to the semiconductor layer 132 through the contact hole 161 for the source electrode and the contact hole 162 for the drain electrode, respectively. Further, the data line 171, the common power source line 172, and the second capacitor plate 178 are formed on the interlayer insulating layer 160. In this case, the source electrode 176 and the second capacitor plate 178 are extended from the common power source line 172 (see FIG. 3D).

Accordingly, the driving TFT 20 is formed, and the capacitor 80 including a pair of the capacitor plates 158 and 178 with the interlayer insulating layer 160 interposed therebetween is also formed. Herein, the interlayer insulating layer 160 acts as a dielectric material that includes the organic layer.

Figure 3E:
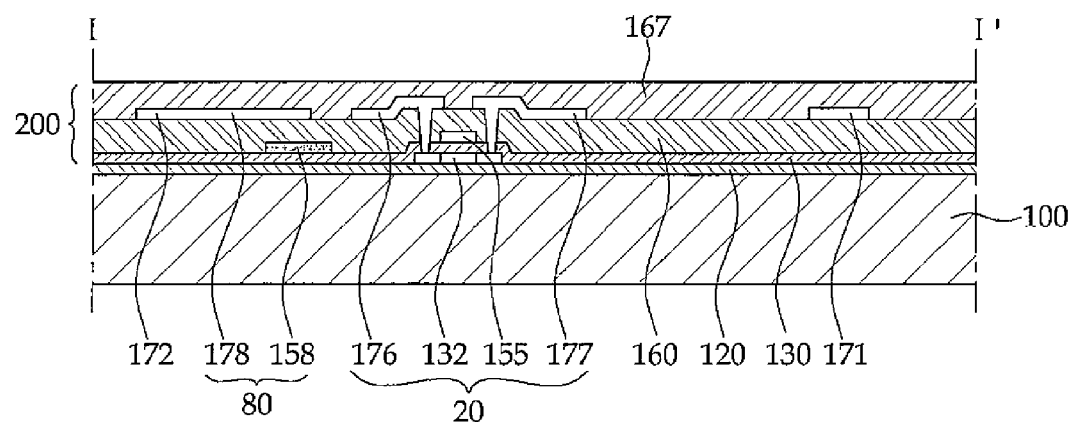
Figure 3F:
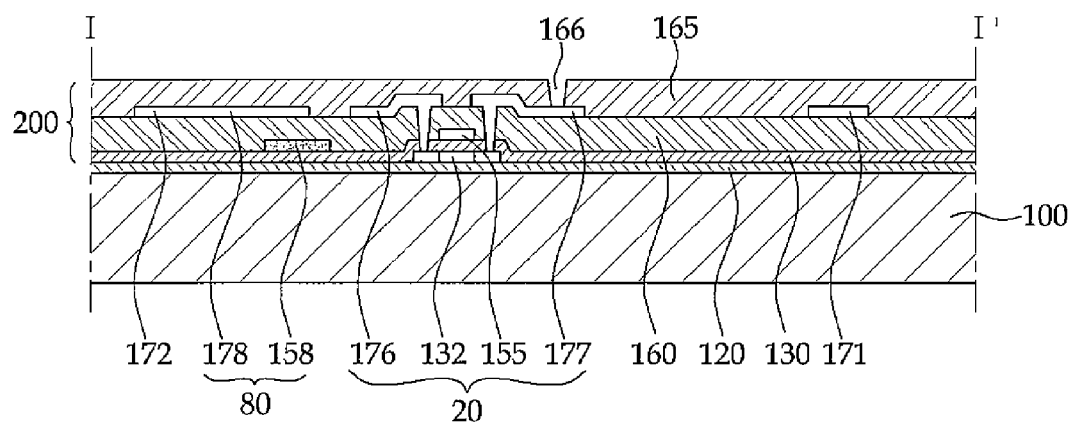
Figure 3G:
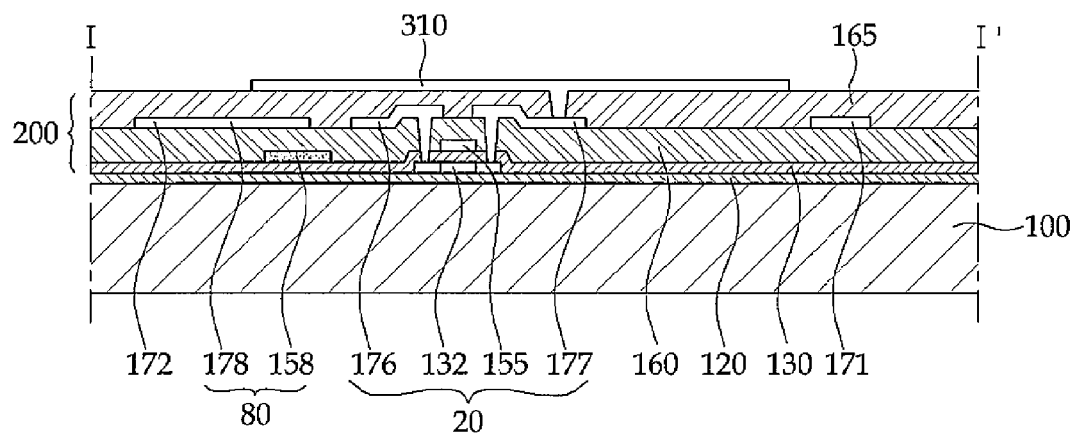
Figure 3H:
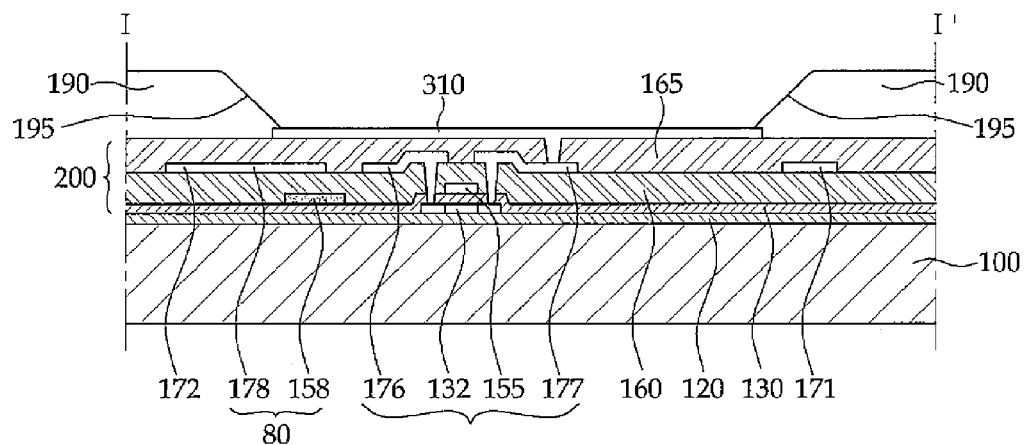
Figure 3I:
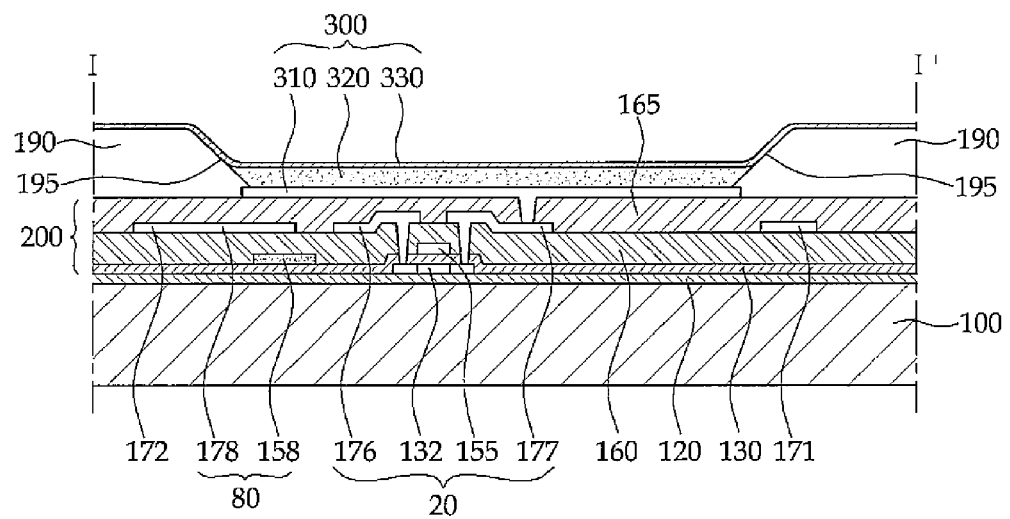

In order to form the planarization layer 165, the photosensitive resin composition is coated on the interlayer insulating layer 160, and a solvent is removed by pre-bake, so that the photosensitive resin layer 167 is formed (see FIG. 3E). The pre-bake may be performed at a temperature of about 60° C. to about 130° C.

The photosensitive resin composition to form the planarization layer 165 may be identical to or different from the photosensitive resin composition to form the interlayer insulating layer 160. A composition may be adjusted by those skilled in the art in order to achieve a desired photosensitive resin composition.

A contact hole-forming region for the first electrode are selectively exposed to light by the exposure apparatus. In the case of using (utilizing) the digital exposure apparatus, the exposure may be performed without a separate pattern mask. The h-line may be used (utilized) as a light source, and the acid-labile resin may be deprotected in the exposed area although the post exposure bake is not performed. After the exposure, the photosensitive resin layer 167 is selectively developed by the alkaline solution so that a contact hole 166 for the first electrode is formed. Next, the photosensitive resin layer 167 is heat-cured at a temperature of about 150° C. to about 350° C., so that the planarization layer 165 including the organic layer is formed (see FIG. 3F). The planarization layer 165 has the contact hole 166 for the first electrode as a pattern.

As described above, in the case where the photosensitive resin composition is used (utilized), a pattern may be formed on the interlayer insulating layer 160 and the planarization layer 165 without lithography using (utilizing) a photoresist. Therefore, a process for forming a layer may be simplified by using (utilizing) the photosensitive resin composition according to an embodiment of the present invention.

Herein, the photosensitive resin layer of a non-exposed area may be the organic layer. Therefore, the organic layer may include the acid-labile resin and the photoacid generator.

The first electrode 310 is formed on the planarization layer 165. The first electrode 310 serves as an anode, and is connected to the drain electrode 177 through the contact hole 166 for the first electrode (see FIG. 3G).

The pixel defining layer 190 is disposed on the planarization layer 165 in order to insulate the first electrodes 310 from each other and define an emission area. The pixel defining layer 190 has an opening 195 so that the first electrode 310 is partly exposed (see FIG. 3H).

The organic light emitting layer 320 and the second electrode 330 are sequentially laminated in the opening 195 of the pixel defining layer 190. As a result, the OLED 300, including the first electrode 310, the organic light emitting layer 320, and the second electrode 330, is formed (see FIG. 3I).

According to an embodiment of the present invention, a display substrate includes an organic layer formed by the above method. In more detail, the display substrate includes a substrate and the organic layer on the substrate, and the organic layer includes an acid-labile resin having a polymerization unit represented by any one of Formulas 6a to 6c, and a photoacid generator.

Hereinbefore, the method for manufacturing the OLED display as an example of display devices using (utilizing) the photosensitive resin composition has been described.

The photosensitive resin composition may be usefully applied to form an organic insulating layer having a pattern, such as the interlayer insulating layer 160 or the planarization layer 165. In this embodiment, the organic layer having a contact hole is discussed, but the kinds of the organic layer are not limited thereto, and the photosensitive resin composition may also be applied to form the organic layer with no pattern. Further, the photosensitive resin composition may be used (utilized) to form an insulating layer or organic layer of other electronic components, e.g., semiconductors, besides the display devices.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. A photosensitive resin composition comprising:
an acid-labile resin of about 5 wt % to about 25 wt %;
a monomer of about 5 wt % to about 10 wt %;
a photoacid generator of about 5 wt % to about 10 wt %;
a photoreaction accelerator of about 1 wt % to about 5 wt %; and
a solvent of about 50 wt % to about 84 wt %,
wherein the acid-labile resin comprises a repeating unit comprising an acid group and a protecting group, the protecting group configured to protect the acid group.

2. The photosensitive resin composition of claim 1, wherein the protecting group comprises at least one selected from 2-tetrahydropyranyl group, vinyl ether group, 2-tetrahydrofuranyl group, 2,3-propylenecarbonate group, methoxy ethoxy ethyl group, and acetoxy ethoxy ethyl group.

3. The photosensitive resin composition of claim 1, wherein the repeating unit is derived from any one of the following Formulas 1 and 2:

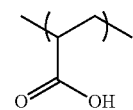

Formula 1]

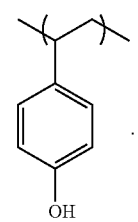

Formula 2

4. The photosensitive resin composition of claim 1, wherein the acid-labile resin comprises at least one selected from an acrylic resin and a novolac resin.

5. The photosensitive resin composition of claim 1, wherein the acid-labile resin comprises a copolymerized part represented by any one of the following Formulas 6a to 6c:

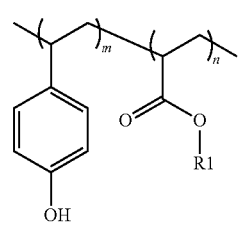

Formula 6a

-continued

Formula 6b

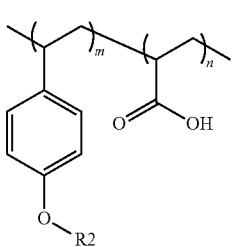

Formula 6c

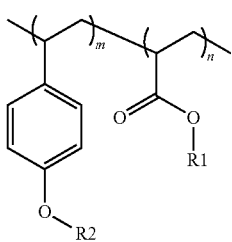

wherein n and m are each an integer of 1 to 100, and R1 and R2 are each independently selected from 2-tetrahydropyranyl group, vinyl ether group, 2-tetrahydrofuranyl group, 2,3-propylenecarbonate group, methoxy ethoxy ethyl group, and acetoxy ethoxy ethyl group.

6. The photosensitive resin composition of claim 1, wherein the monomer comprises at least one selected from vinyl-based monomer, acrylic-based monomer, styrene-based monomer, and phenol-based monomer.

7. The photosensitive resin composition of claim 1, wherein the photoacid generator is activated by h-line.

8. The photosensitive resin composition of claim 1, wherein the photoacid generator comprises at least one selected from compounds represented by any one of the following Formulas 7a to 7c and 8a to 8c:

Formula 7a

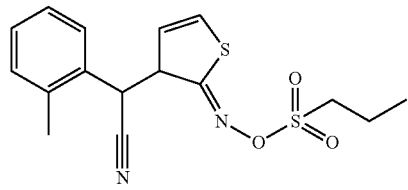

Formula 7b

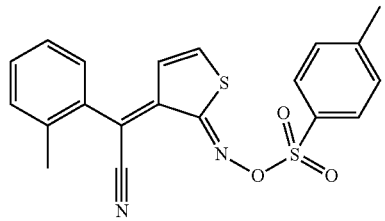

Formula 7c

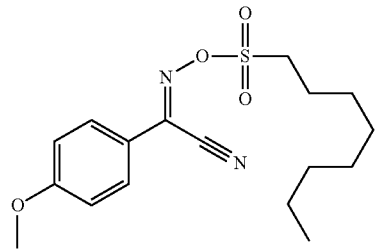

Formula 8a

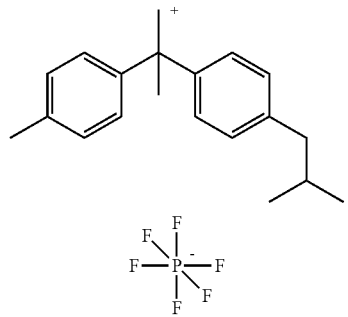

Formula 8b

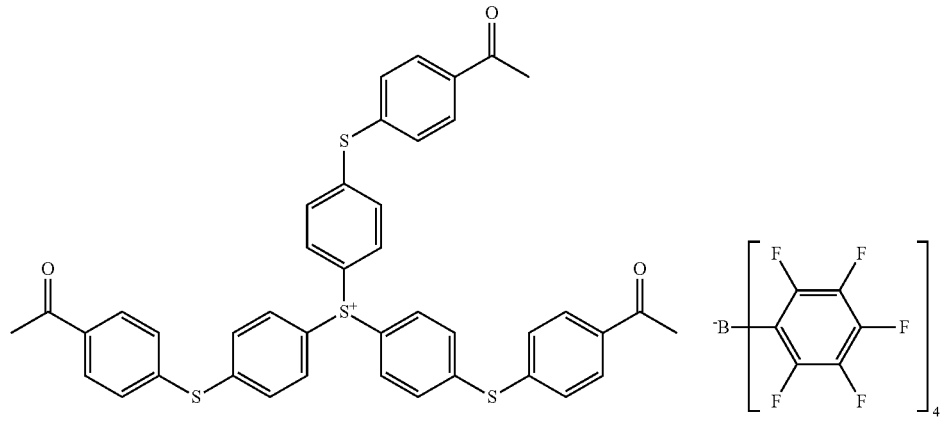

-continued

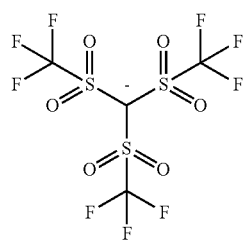

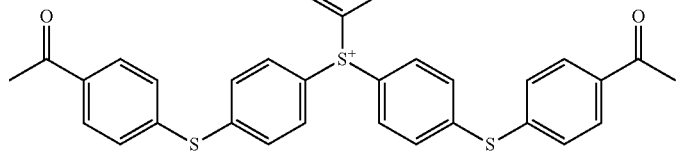

Formula 8c

9. The photosensitive resin composition of claim 1, wherein the photoreaction accelerator comprises at least one selected from a sensitizer and a wavelength shifter.

10. The photosensitive resin composition of claim 9, wherein the sensitizer comprises at least one selected from diethylenethioxanthone (DETX), violanthrone, iso-violanthrone, fluoresceine, rubrene, 9,10-Diphenylanthracene, tetracene, 13,13'-Dibenzantronile, and levulinic acid.

11. The photosensitive resin composition of claim 9, wherein the wavelength shifter comprises at least one selected from n-(2-phenyl-1,3-benzoxazol-5-yl)naphthalene-1-1-carboxamide, 7-(diethylamino)-4-(trifluoromethyl)-2H-chromen-2-one, p-Terphenyl (PTP), diphenyloxazole-benzene (POPOP), diphenyloxazole (PPO), and tetraphenyl-butadiene (TPB).

12. The photosensitive resin composition of claim 1, wherein the repeating unit is represented by any one of the following Formulas 4 and 5:

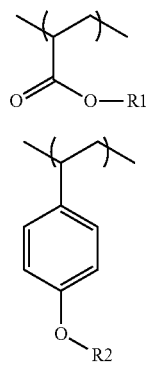

Formula 4

Formula 5 wherein R1 and R2 are each independently selected from 2-tetrahydropyranyl group, vinyl ether group, 2-tetrahydrofuranyl group, 2,3-propylenecarbonate group, methoxy ethoxy ethyl group, and acetoxy ethoxy ethyl group.

13. A method of forming an organic layer, the method comprising:
forming a photosensitive resin layer by coating the photosensitive resin composition according to claim 1 on a substrate;
selectively exposing the photosensitive resin layer to light;
developing the selectively exposed photosensitive resin layer; and
curing the photosensitive resin layer.

14. The method of claim 13, wherein the substrate is for a display device.

15. A display device comprising:
a substrate and an organic layer on the substrate,
wherein the organic layer comprises an acid-labile resin having a polymerization unit represented by any one of the following Formulas 6a to 6c, and a photoacid generator:

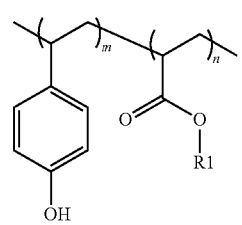

Formula 6a

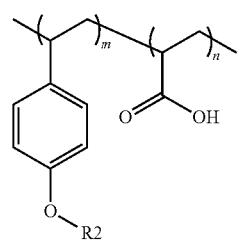

Formula 6b

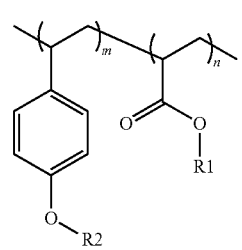

Formula 6c wherein n and m are each an integer of 1 to 100, and R1 and R2 are each independently selected from 2-tetrahydropyranyl group, vinyl ether group, 2-tetrahydrofuranyl group, 2,3-propylenecarbonate group, methoxy ethoxy ethyl group, and acetoxy ethoxy ethyl group.

* * * * *